United States Patent
Lee et al.

(10) Patent No.: US 9,351,421 B2
(45) Date of Patent: May 24, 2016

(54) SERVER HOUSING

(71) Applicant: EchoStreams Innovative Solutions,LLC, Arcadia, CA (US)

(72) Inventors: Cheng-Chu Lee, New Taipei (TW); Gene Jingluen Lee, New Taipei (TW); Chang-Feng Chu, New Taipei (TW)

(73) Assignee: ECHOSTREAMS INNOVATIVE SOLUTIONS, LLC, Arcadia, CA (US)

( * ) Notice: Subject to any disclaimer, the term of this patent is extended or adjusted under 35 U.S.C. 154(b) by 151 days.

(21) Appl. No.: 14/194,937

(22) Filed: Mar. 3, 2014

(65) Prior Publication Data

US 2015/0173234 A1    Jun. 18, 2015

(30) Foreign Application Priority Data

Dec. 18, 2013    (TW) .............................. 102223935 U

(51) Int. Cl.
*H05K 7/14* (2006.01)
*G11B 33/12* (2006.01)

(52) U.S. Cl.
CPC ............ *H05K 7/1487* (2013.01); *G11B 33/128* (2013.01)

(58) Field of Classification Search
CPC . H05K 7/1487; H05K 7/1489; H05K 7/1411; G06F 1/187
See application file for complete search history.

(56) References Cited

U.S. PATENT DOCUMENTS

| | | | |
|---|---|---|---|
| 2003/0112596 A1* | 6/2003 | Shih | G06F 1/184 361/679.33 |
| 2007/0051525 A1* | 3/2007 | Chen | G06F 1/183 174/50 |
| 2007/0230110 A1* | 10/2007 | Starr | G11B 33/10 361/679.31 |
| 2007/0230111 A1* | 10/2007 | Starr | H05K 7/1487 361/679.31 |
| 2007/0233781 A1* | 10/2007 | Starr | G11B 33/128 709/203 |
| 2008/0037209 A1* | 2/2008 | Niazi | G06F 1/181 361/727 |
| 2009/0296322 A1* | 12/2009 | Yang | H05K 7/1487 361/679.01 |
| 2011/0176271 A1* | 7/2011 | Zhang | G06F 1/20 361/679.33 |

(Continued)

*Primary Examiner* — Hoa C Nguyen
*Assistant Examiner* — Keith Depew
(74) *Attorney, Agent, or Firm* — Li & Cai Intellectual Property (USA) Office

(57) ABSTRACT

A server housing for accommodating plurality of hard drives includes a shell body and a plurality of cases. The shell body has a bottom wall, a circuit region and a plurality of partition walls parallel to each other. The circuit region and the partition walls are disposed on the bottom wall. The cases are respectively drawably disposed between the partition walls. A plurality of separation boards and a plurality of electrical contacts are disposed in the cases for accommodating the hard drives between the separation boards. Each of the separation boards has a planar face and a pair of abutting walls. A plurality of abutting protrusions is formed on each of the abutting walls and protrudes inward. The abutting protrusions of the abutting walls abut the hard drives between the separation boards. The electrical contacts provide electrical connection between the hard drives and the circuit region.

8 Claims, 9 Drawing Sheets

(56) References Cited

U.S. PATENT DOCUMENTS

| | | | | |
|---|---|---|---|---|
| 2011/0222234 A1* | 9/2011 | Davis | G11B 33/128 | 361/679.33 |
| 2012/0020005 A1* | 1/2012 | Collins | G11B 33/08 | 361/679.33 |
| 2012/0020007 A1* | 1/2012 | Collins | G11B 33/128 | 361/679.39 |
| 2013/0021740 A1* | 1/2013 | Hamand | G06F 1/183 | 361/679.31 |
| 2013/0141851 A1* | 6/2013 | Yang | H05K 7/1487 | 361/679.02 |
| 2013/0229767 A1* | 9/2013 | Ganta Papa Rao Bala | G11B 33/128 | 361/679.37 |
| 2013/0258620 A1* | 10/2013 | Qiu | G06F 1/187 | 361/759 |
| 2013/0342989 A1* | 12/2013 | Singleton | G06F 1/187 | 361/679.39 |
| 2014/0085804 A1* | 3/2014 | Song | G06F 1/183 | 361/679.33 |
| 2014/0085805 A1* | 3/2014 | Xu | G06F 1/183 | 361/679.33 |
| 2014/0085806 A1* | 3/2014 | Song | G06F 1/183 | 361/679.37 |
| 2014/0117822 A1* | 5/2014 | Fan | H05K 7/1487 | 312/223.2 |
| 2014/0153181 A1* | 6/2014 | Peng | H05K 7/1489 | 361/679.39 |
| 2014/0204537 A1* | 7/2014 | Rust | H05K 7/02 | 361/727 |
| 2014/0307400 A1* | 10/2014 | French, Jr. | H05K 7/1427 | 361/755 |
| 2014/0362515 A1* | 12/2014 | Pronozuk | H05K 7/1487 | 361/679.31 |
| 2014/0374366 A1* | 12/2014 | Tsai | G11B 33/00 | 211/26 |
| 2015/0043146 A1* | 2/2015 | Li | H05K 7/1487 | 361/679.31 |
| 2015/0156902 A1* | 6/2015 | Terwilliger | H05K 7/1487 | 312/333 |
| 2015/0173235 A1* | 6/2015 | Ma | H05K 7/1487 | 361/679.58 |

* cited by examiner

SERVER HOUSING

BACKGROUND OF THE INVENTION

1. Field of the Invention

The present disclosure relates to a server housing; in particular, to a server housing for accommodating a plurality of hard drives.

2. Description of Related Art

As the amount of data handled and stored increase dramatically in the datacenter, the cost to keep the older data (archive) in the primary storage systems has become very expensive. Primary storage systems are used to keep fresh data that are likely to be frequently accessed, and need to be accessed in real time. This type of data is often referred to as online data or hot data. However, older data, such as older emails and old photos, that are less likely to be needed or do not need to be accessed in real time, can be stored in less expensive storage systems that offer slower response time, and the older data may even stay offline until needed. This type of data storage systems are referred to as near-line and offline, or warm Storage and cold storage. Therefore, there is a demand to provide lower cost storage platforms that meet the usage model of warm or cold storage.

Specifically, cold storage needs to minimize the system maintenance efforts, provide easy access to failed parts, and maximize the density of the hard drives to make efficient use of the available space. Therefore, using a storage solution that provides convenient and easy access to the hard drives and accommodates the hard drives compactly to make economical use of the available space is essential to satisfying the requirements of cold storage.

SUMMARY OF THE INVENTION

The object of the present disclosure is to increase accessibility and compactness of hard drives in housings.

In order to achieve the aforementioned objects, the present disclosure provides a server housing for accommodating a plurality of hard drives. The server housing includes a shell body and a plurality of cases. The shell body has a bottom wall, a circuit region and a plurality of parallel partition walls. The circuit region and the partition walls are disposed on the bottom wall. The cases can be retrievably disposed between the partition walls, respectively. Each of the cases has a plurality of separator boards and a plurality of electrical contact points. The hard drives can be accommodated between the separation boards. Each of the separation boards has a separation face and a pair of abutting walls extending respectively from the two sides of the separation face. The abutting walls extend inward to form a plurality of abutting protrusions. The abutting protrusions of the abutting walls abut one of the hard drives. The electrical contact points provide electrical connection for the hard drives to the circuit region.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
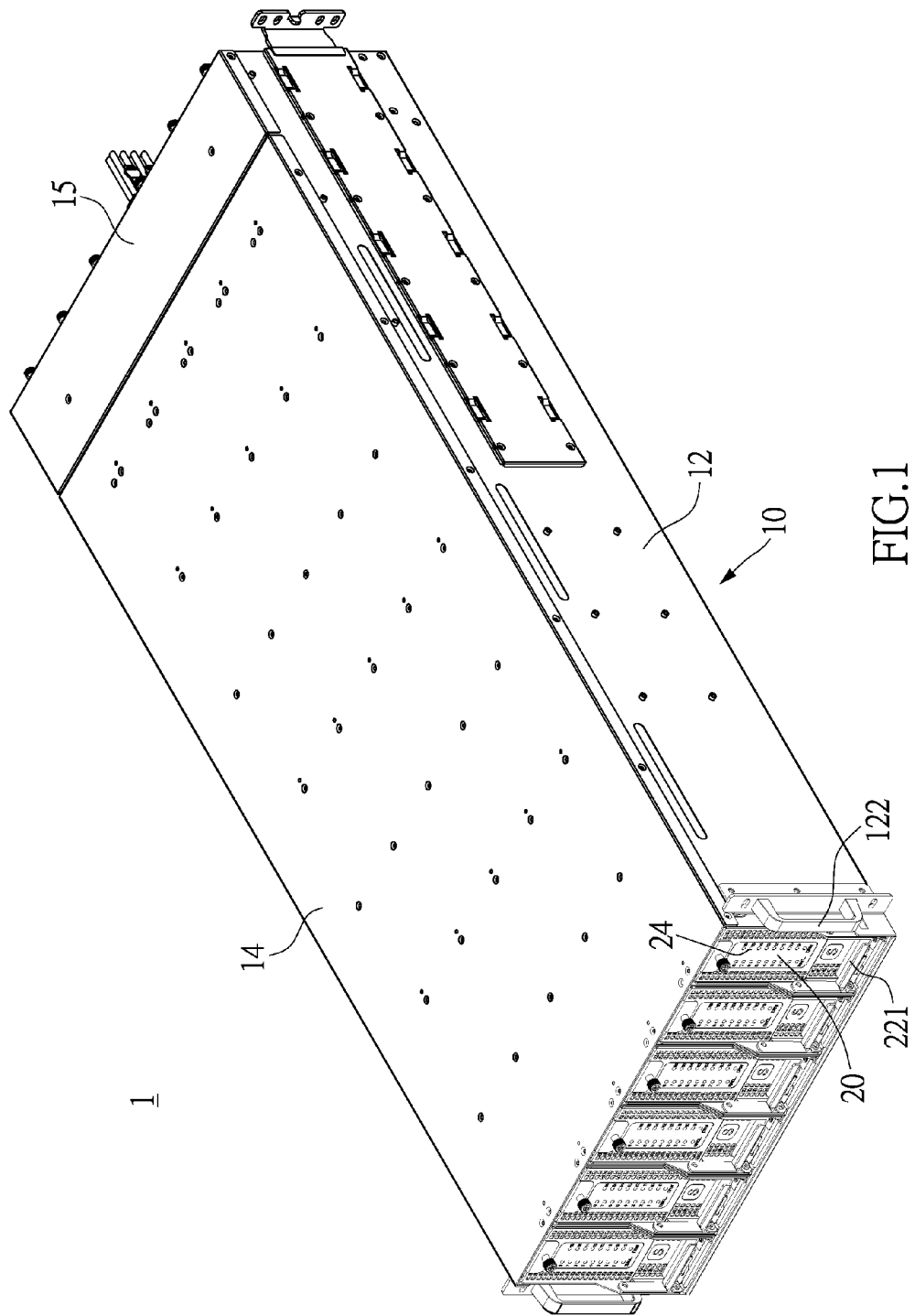
FIG. 1 shows a perspective view of a server housing according to the present disclosure.

Referring to FIG. 1, the present disclosure provides a server housing 1 which accommodates a plurality of hard drives 9 for increasing the capacity of the server housing 1 and increasing the overall operation speed. The server housing 1 includes a shell body 10 and a plurality of cases 20. The cases 20 are accommodated in the shell body 10. Each of the cases 20 can accommodate 9 hard drives. The cases 20 are disposed in the shell body 10 and can be drawn in and out. The following describes the structures of the shell body 10 and the cases 20, and then the relationship of engagement between the shell body 10 and the cases 20, and then the relationship of accommodation between the cases 20 and the hard drives 9.

Figure 2:
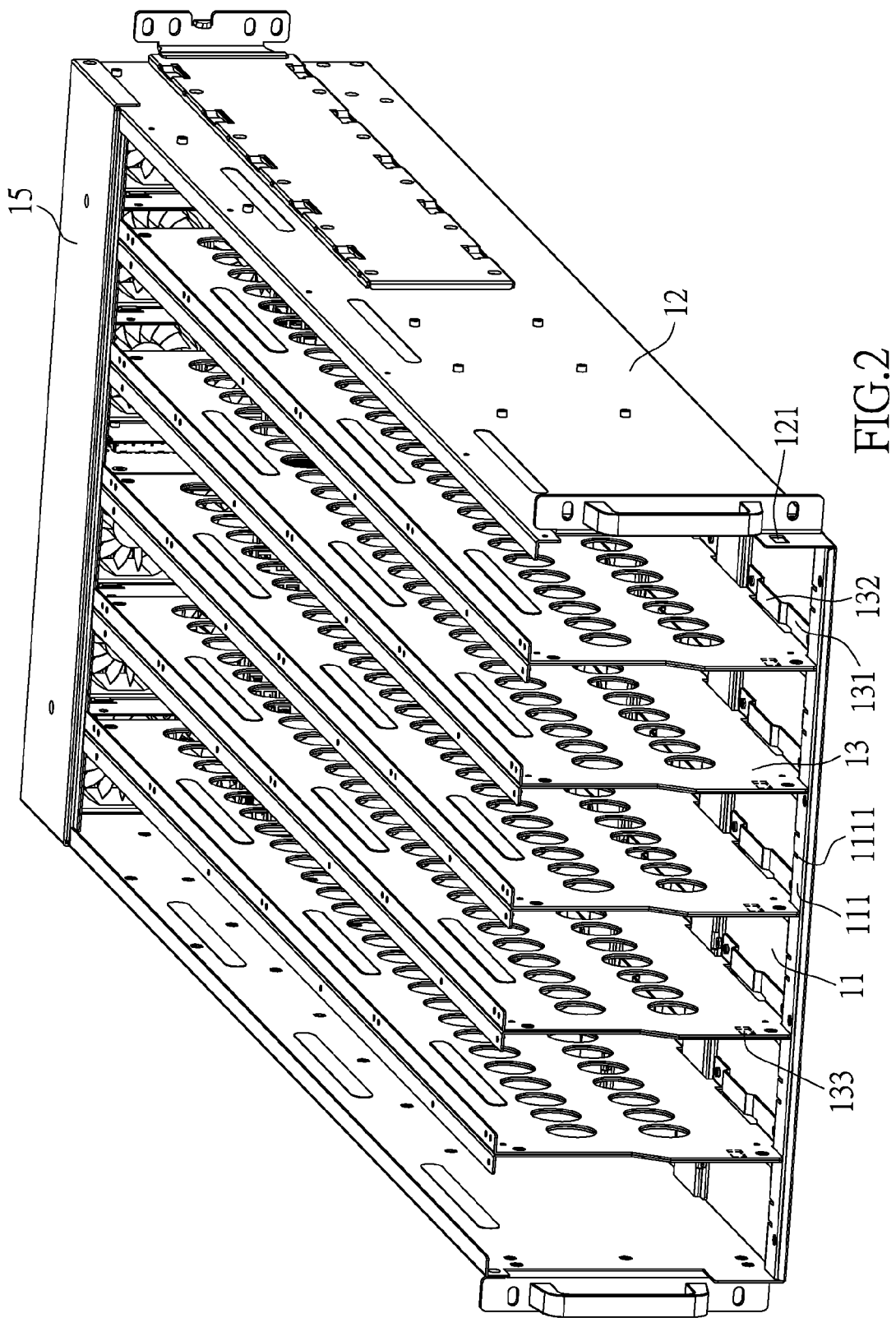
FIG. 2 shows a perspective view of a shell body of a server housing according to the present disclosure.

Referring to FIG. 1 and FIG. 2, the shell body 10 has a bottom wall 11, a pair of side walls 12, a plurality of partition walls 13, a top cover 14, and a circuit region 15. The bottom wall 11, the side walls 12 and the top cover 14 define a rectangular space. The partition walls 13 are parallel to the side walls 12 and are disposed at intervals on the bottom wall 11. The circuit region 15 covers an opening on one end of the rectangular space defined by the bottom wall 11, the side walls 12 and the top cover 14.

Referring to FIG. 2, a horizontal abutting strip 111 is disposed on the bottom wall 11. The horizontal abutting strip 111 is disposed at an opening on the other end of the rectangular space, opposite the opening covered by the circuit region 15. The abutting strip 111 has a plurality of engagement grooves 1111 facing the end covered by the circuit region 15. Each of the side walls 12 has an engagement hole 121 and a handle 122 at the opening opposite the circuit region 15. The second handle 122 is held on the side facing the opening opposite the covering region 15. The portions of the partition walls 13 proximal to the bottom wall 11 extend to form respective extension portions 131 substantially parallel to the bottom wall 11. The partition walls 13 are disposed on the bottom wall 11 by fixing the respective extension portions 131. The extension portion 131 bends to form contact protrusions 132. In other words, the bottom wall has contact protrusions 132 facing the top cover. Each of the partition walls 13 has an engagement hole 133 having similar structure to that of the engagement holes 121 of the side walls 12.

Figure 3:
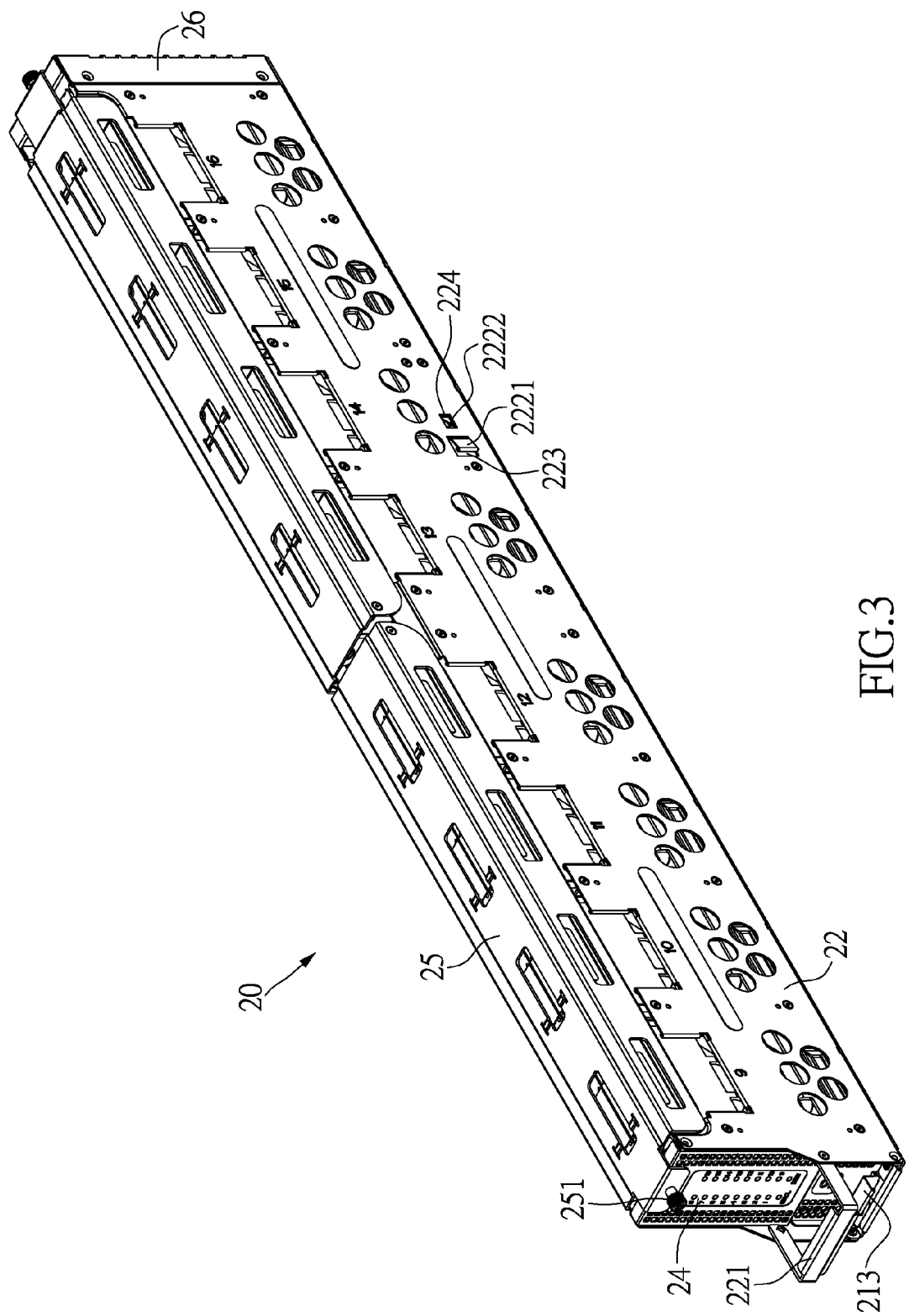
FIG. 3 shows a perspective view of a case of a server housing according to the present disclosure.
Figure 4:
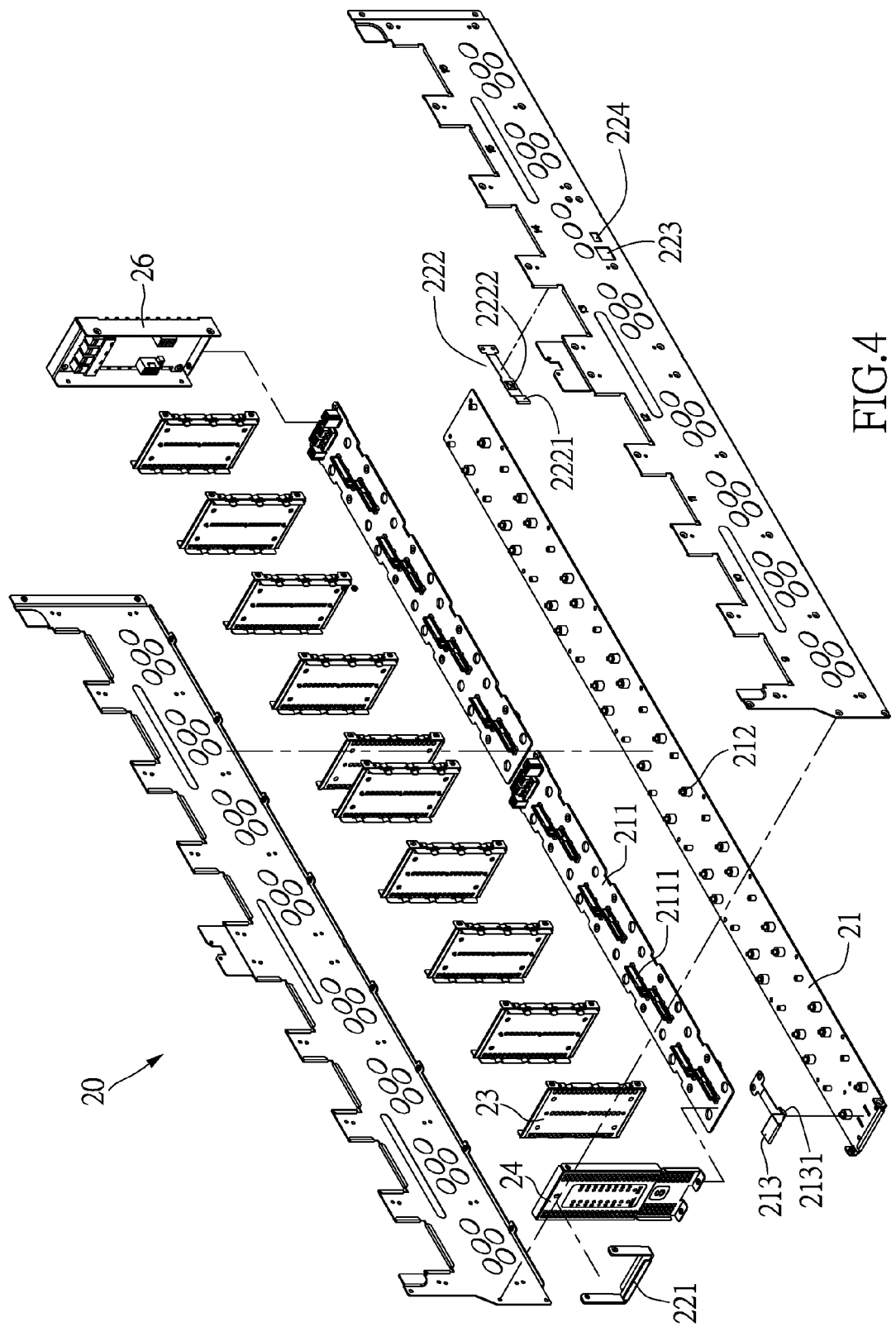
FIG. 4 shows an exploded view of a case of a server housing according to the present disclosure.

Referring to FIG. 3 and FIG. 4, the case 20 includes a bottom board 21, a pair of side boards 22, a separation board 23, a display panel 24, a fixture lid 25 and an adapter board. The side boards 22 are respectively disposed at two sides of the bottom board 21. The separation board 23 is disposed between the two side boards 22. The display panel 24 and the adapter board 26 are respectively disposed at two ends of the bottom board 24. The fixture lid 25 is pivotally connected to the two side boards 22 such that the fixture board 25 can selectively close upon the portion between the side boards 22.

A circuit board 211 and a plurality of support columns 212 are disposed on the bottom board 21. The circuit board 211 is disposed on the side of the bottom board 21 facing the fixture lid 25. The support columns 212 pass through and protrude from the circuit board 211. A plurality of connectors 2111 is disposed on the circuit board 211 to serve as electrical contacts. As mentioned above, the display panel 24 and the adapter board 26 are respectively disposed at two ends of the bottom board 21, and the display panel 24 and the adapter board 26 are electrically connected to the circuit board 211.

The two side boards 22 have a first handle 221 therebetween. The two ends of the first handle 221 are each pivotally connected to the side board 22. One of the side board 22 has an elastic plate 222, a first through hole 223 and a second through hole 224. The first through hole 223 and the second through hole 224 are formed at the midsection of the side board 22. The first through hole 223 is closer to the display panel 24 than the second through hole 224 is. The elastic plate 222 has an elastic section 2221 and an engagement block 2222. The width of the elastic section 2221 is greater than the width of the engagement block 2222. As shown in FIG. 4, the elastic plate 222 is disposed on the inner surface of the side board 22. As shown in FIG. 3, the elastic section 2221 passes through the first through hole 223, and the engagement block 222 protrudes from the second through hole 224.

Figure 5:
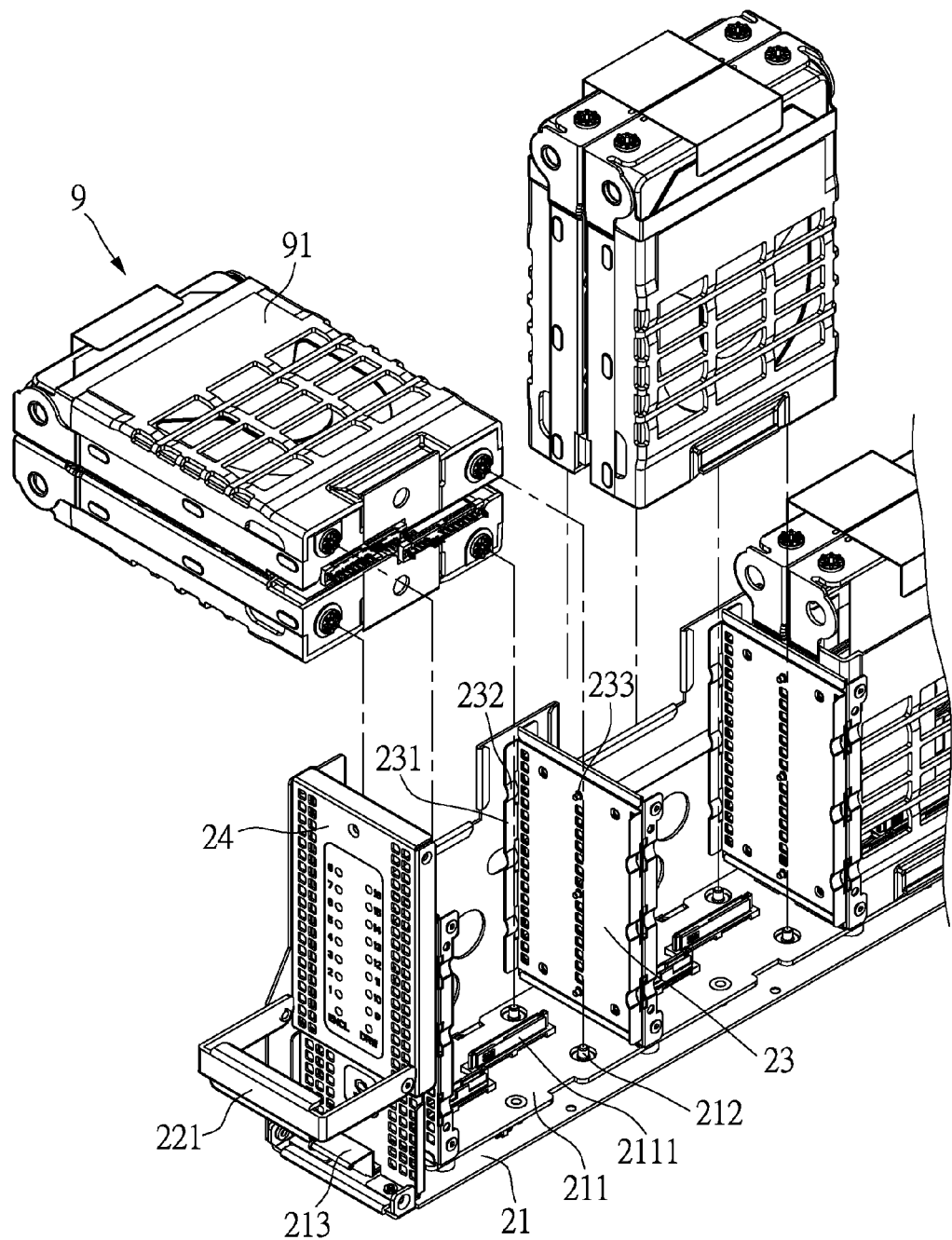
FIG. 5 shows an assembly view of a case and hard drives of a server housing according to the present disclosure.

As shown in FIG. 5, each of the hard drives 9 is disposed between two neighboring separation boards 23. The two sides of each of the separation board 23 proximal to the side boards 22 respectively extend toward a neighboring separation board 23 to form extended sides 231. Referring to FIG. 5, the extension sides 231 are bent to form a plurality of abutting protrusions 232. The abutting protrusions 232 of two sides of a separation board 23 are located at the same heights. The distance between two corresponding abutting portions 232 is slightly smaller than the thickness of a hard drive 9. Each of the separation boards 23 has a plurality of fixture bolts 233 protruding toward a neighboring separation board 23. The fixture bolts 233 are disposed substantially at the middle portion of the respective separation boards 23.

In the present embodiment, the midsection of each of the cases 20 is pivotally connected to two fixture lids 25, such that the fixture lids 25 are evenly closed upon the two side boards 22. The elastic plate 222, the first through hole 223 and the second through hole 224 are generally located around the pivotal connection of the two fixture lids 25. Define the portion of the case 20 covered by the fixture lid 25 closer to the display panel 24 as the first section. Define the portion of the case 20 covered by the other fixture lid 25 as the second section. The fixture lid 25 proximal to the display panel 24 has an abutting screw 251 disposed at the overhanging end thereof. The end of the abutting screw 251 to be handled (e.g. turned by the hand) faces outward, and the other end of the abutting screw 251 faces the display panel 24, such that a user can turn the abutting screw 251 to fix the fixture lid 25. The other fixture lid 25 likewise has an abutting screw 251 disposed at the overhanging end thereof proximal to the adapter board 26, for fixing the fixture lid 25. The abutting screws 251 of the present embodiment can be turned by bare hands.

Referring to FIG. 1, the cases 20 are accommodated in the shell body 10, the display panels 24 of the cases 20 are exposed at one end of the shell body 10, the adapter boards 26 of the cases 20 correspond to and are electrically connected to the circuit regions 15 of the shell body 10, the abutting foot 2131 of the abutting elastic plates 213 of the cases 20 (refer to FIG. 3) respectively engage the engagement grooves 1111 of the horizontal abutting strip 111 such that the cases 20 do not easily slide out of the shell body 10. Additionally, the first handles 221 are respectively in contact with the display panels 24 such that the first handles 221 do not occupy extra space. The bottom wall 11 of the shell body 10 has contact protrusions 132 of the partition walls 13. The cases 20 abut the contact protrusions 132 such that the friction between the cases 20 and the shell body 10 is smaller.

Figure 6:
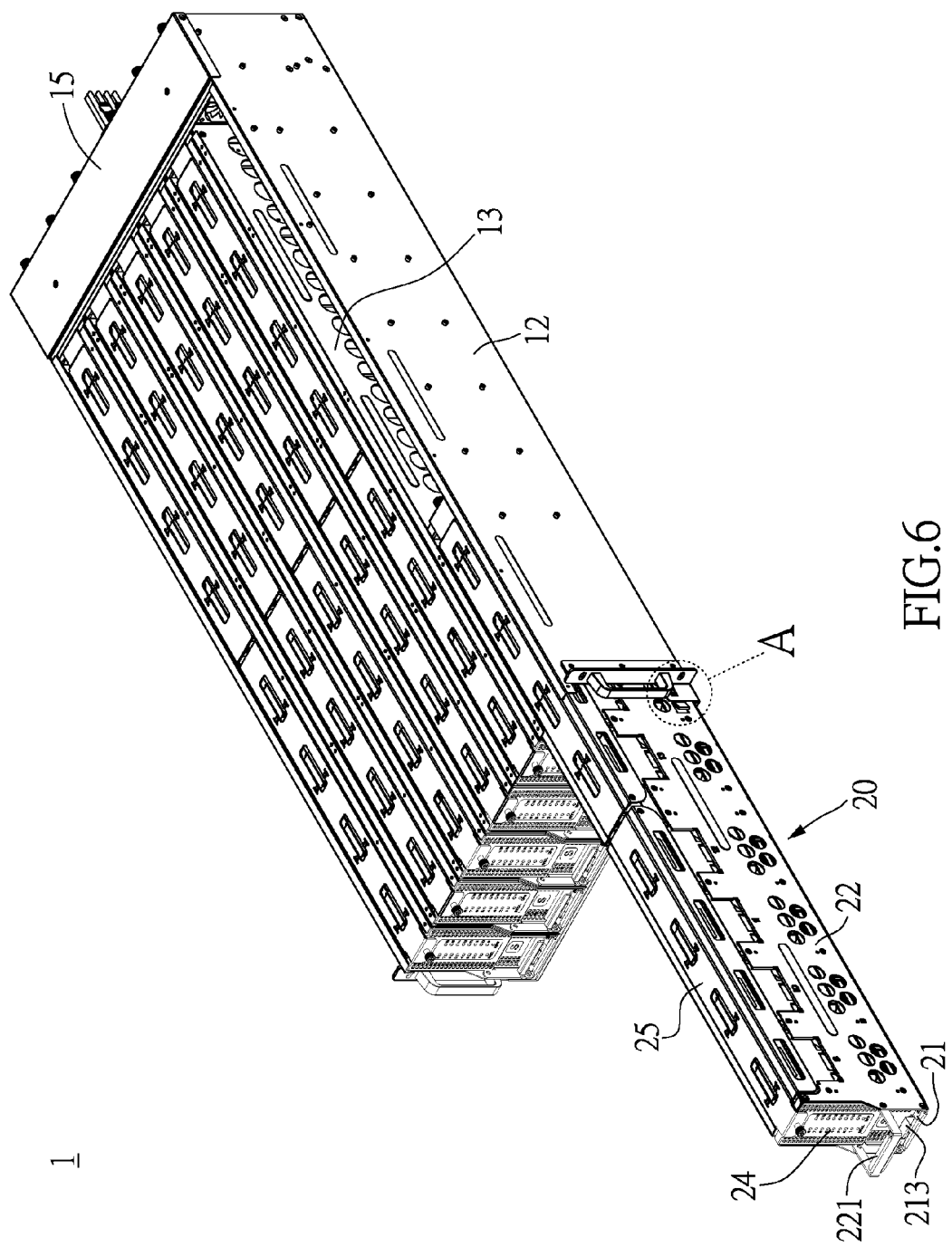
FIG. 6 shows a perspective view of a server housing in another state according to the present disclosure.

As shown in FIG. 6, when the user intends to retrieve a hard drive 9, the user can draw out the case 20 accommodating the hard drive 9. The user can flip the first handle 221 and pull the abutting elastic plate 213 upward, such that the abutting foot 2131 disengages the engagement grooves 1111 and the user pulls out the case 20 through the first handle 221.

Figure 6A:
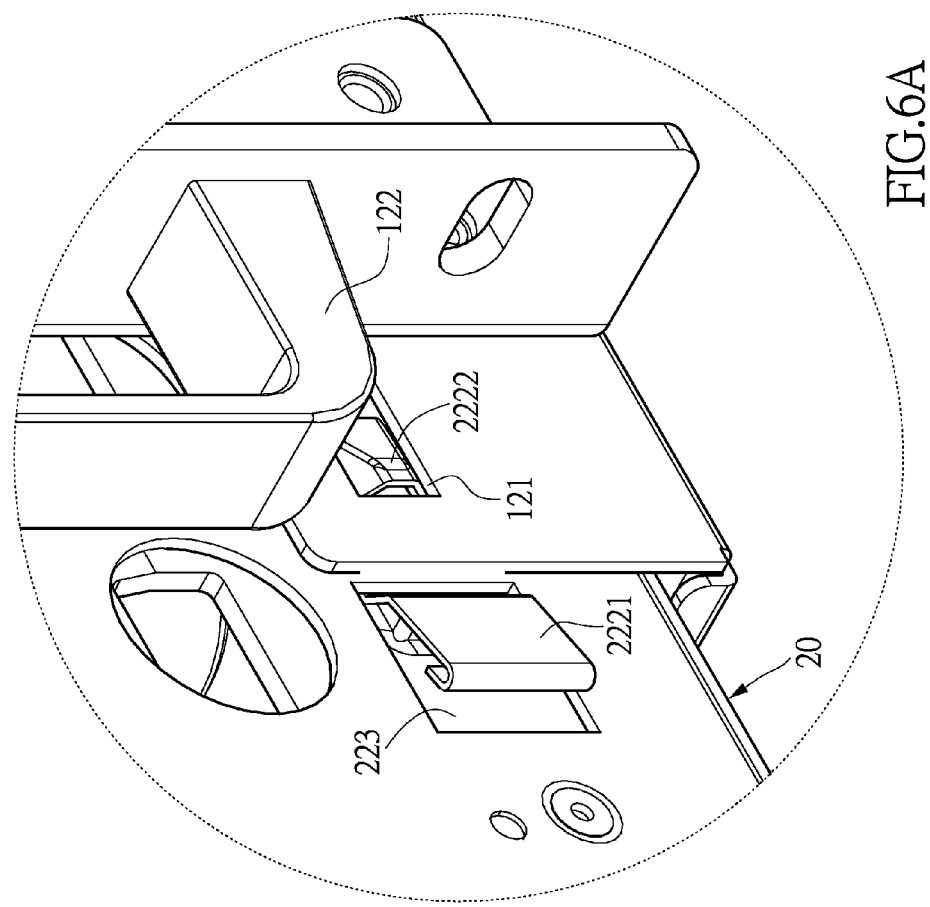
FIG. 6A shows an enlarged view of the interference portion between a case and a shell body of a server housing according to the present disclosure.
Figure 7:
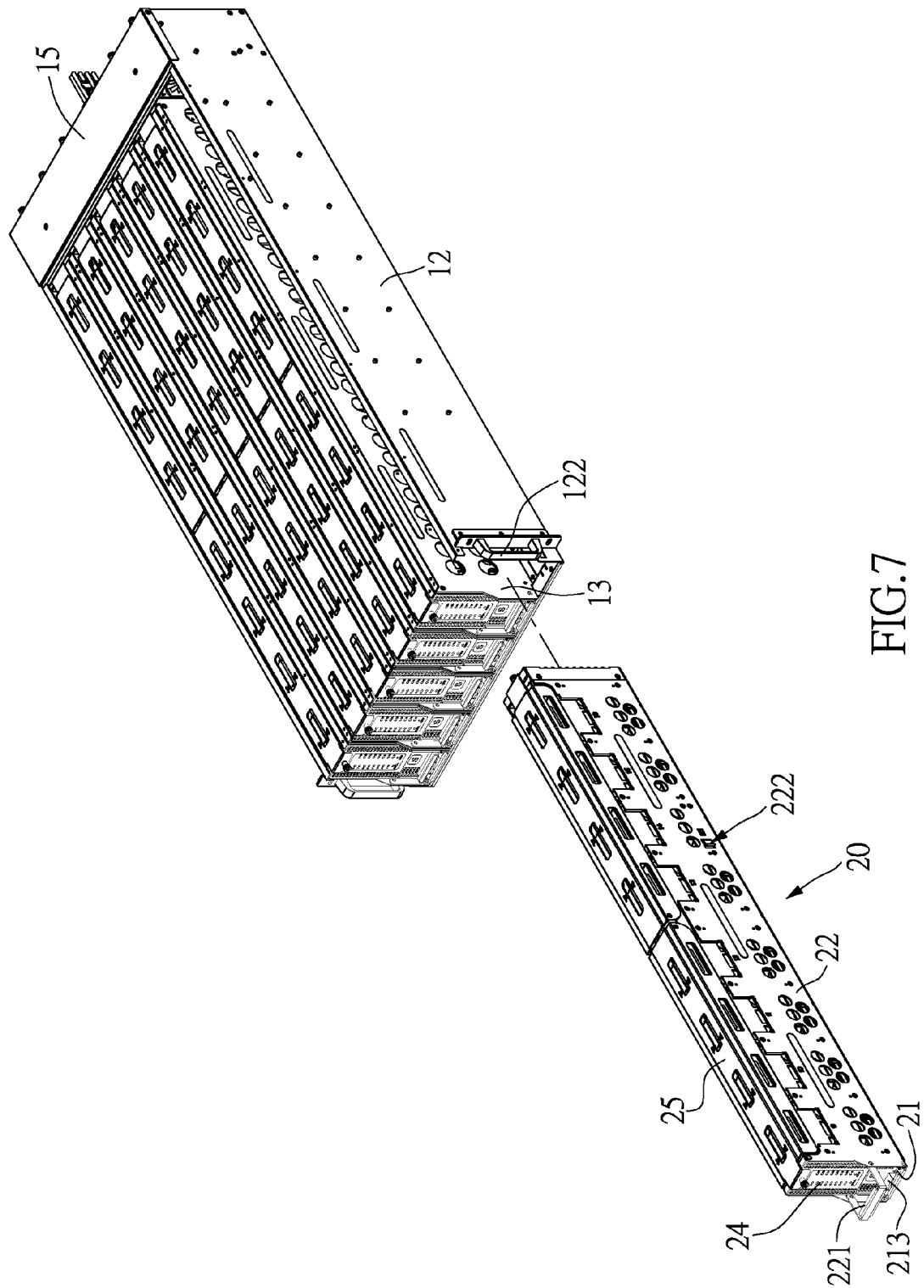
FIG. 7 shows a perspective view of a case retrieved from a shell body of a server housing according to the present disclosure.
Figure 8:
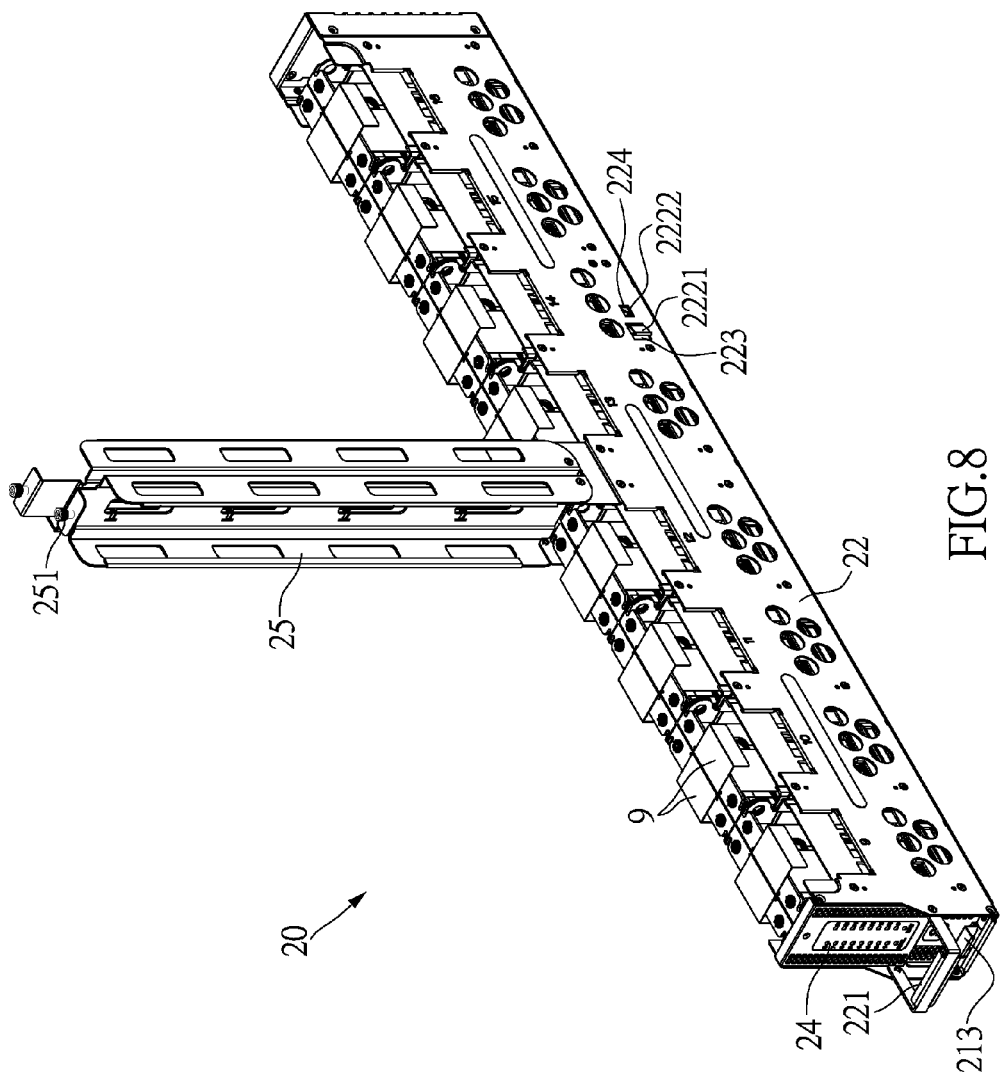
FIG. 8 shows a perspective view of a server housing with an open fixture lid according to the present disclosure.

As shown in FIG. 6, the case 20 cannot be pulled out completely in one go, preventing the user from accidentally pulling out the case 20 completely. The case 20 can be heavy and the user may not be able to bear the weight of the case 20 and drop the case 20, damaging the hard drives 9. FIG. 6A shows an enlarged view of the interference portion between a case 20 and a shell body 10 of a server housing according to the present disclosure. As shown in FIG. 6A, the engagement block 2222 of the elastic piece 222 engages the engagement hole 121 such that the case 20 cannot move. The elastic section 2221 passes through the first through hole 223 and does not interfere with the shell body 10. The width of the elastic section 2221 is greater than the width of the engagement block 2222 and the width of the engagement hole 121, such that when the case 20 is drawn out the elastic section 2221 is not lodged in the engagement hole 121. Referring to FIG. 6A and FIG. 7, when the user intends to retrieve the case 20, the user can press the elastic section 2221 such that the engagement block 2222 moves inward and disengages the engagement hole 121, 133. No interference exists between the case 20 and the shell body 10 and the second section of the case 20 can be drawn out. As shown in FIG. 8, when the entire case 20 has been drawn out, the two fixture lids 25 can be opened to retrieve the hard drives 9. Rails can be disposed between the case 20 and the shell body 10 (not shown in the figures) to prevent the case 20 from falling.

As shown in FIG. 6, when interference exists between the case 20 and the shell body 10 and only the first section of the case 20 is drawn out, the fixture lid 25 of the first section of the case 20 is entirely outside the shell body 10. So, when the user intends to retrieve hard drives 9 disposed in the first section of the case 20, the user only needs to draw out the first section of the case 20 instead of the entire case 20.

As shown in FIG. 5, two hard drives 9 form a group, each group of hard drives 9 is disposed between two neighboring separation boards 23, the abutting protrusions 232 on two sides of each of the separation boards 23 respectively abut the two hard drives 9 to fix the hard drives 9 in place. No screws are necessary to fix the hard drives 9, the user can retrieve the hard drives 9 more conveniently, space is saved by not using screws, and the amount of hard drives 9 which can be stored is increased.

The fixture bolts 233 are disposed between two hard drives 9 to guide the placement of the hard drives 9. The support columns 212 of the bottom board 21 can support the hard drives 9 such that the hard drives 9 vibrates less easily when the case 20 vibrates. The hard drives 9 do not collide with the case 20 and are not damaged. As shown in FIG. 5, the support columns 212 can correspond to shock absorbing pads on a hard drive box 91 of the hard drive 9. Alternatively, shock absorbing material can be disposed on the support columns 212. When the fixture lid 25 is closed, the fixture lid 25 abuts and fixes the hard drives 9 in the case 20.

After disposing the hard drive 9, disposed the case 20 in the shell body 10, the adapter board 26 connects to the circuit region 15, and the electrical contacts of the hard drives 9 electrically connect to the connectors 2111. The hard drives 9 are electrically connected to the circuit region 15 through the circuit board 211 and the adapter board 26, such that the hard drives 9 can send and receive signals to and from the circuit region 15. Additionally, the circuit region 15 can display the status of each of the hard drives on the display panel 24 for the viewing of the user. If a hard drive 9 is damaged it can be immediately replaced.

In summary of the above, the server housing provided by the present disclosure has the following advantages. The hard drives are compactly clamped by abutting protrusions of separation boards in the case to reduce vibration of the hard drives and collision between the hard drives and the case. Traditional methods using screws are replaced, making it more convenient for the user to access and retrieve hard drives. The case has a handle such that the case can be drawn out of the shell body like a drawer. Fixture lids and abutting screws allows the fixture lids to close upon the case and fix the hard drives. The elastic plate and the engagement hole creates interference between the case and the shell body, such that the case cannot be pulled out in on attempt thereby preventing damage to hard drives. The abutting elastic plates and the horizontal abutting strips allow the case to be stably accommodated in the shell body. The support columns compactly support the hard drives so as to reduce collision between the hard drives and the case. Fixture bolts guide the placement of the hard drives.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. A server housing for accommodating a plurality of hard drive, comprising:
    a shell body having a bottom wall, a circuit region and a plurality of partition walls parallel to each other, wherein the circuit region and the partition walls are disposed on the bottom wall; and
    a plurality of cases drawably disposed between the respective partition walls, wherein a plurality of separation boards and a plurality of electrical contacts are disposed in the cases for accommodating the hard drives between the separation boards, each of the separation boards extends on two sides to form a pair of abutting walls, a plurality of abutting protrusions is formed on each of the abutting walls and protrude inward, the abutting protrusions of the abutting walls abut the hard drives between the separation boards, and the electrical contacts provide electrical connection between the hard drives and the circuit region;
    wherein each of the cases has an elastic plate, the elastic plate has an elastic section and an engagement block, and the shell body has a plurality of engagement holes corresponding to the engagement blocks, and the surface of each of the cases is formed with a first through hole and a second through hole, the elastic section passes through the first through hole, and the engagement block passes through the second through hole.

2. The server housing according to claim 1, wherein a first end of each of the cases correspond to the circuit region, and a second end of each of the cases is exposed at the shell body and has a first handle pivotally connected thereat.

3. The server housing according to claim 1, wherein the bottom face of each of the cases has a plurality of support columns.

4. The server housing according to claim 3, wherein a horizontal abutting strip is disposed at the bottom wall of the shell body, the horizontal abutting strip corresponds to the second end of the cases, the horizontal abutting strip has a plurality of engagement grooves, the second end of the cases has a plurality of abutting elastic plates each having an abutting foot, and the abutting feet pass through the bottom walls of the cases and respectively correspond to the engagement grooves.

5. The server housing according to claim 4, wherein a plurality of fixture bolts are disposed one each of the separation boards.

6. The server housing according to claim 5, wherein two sides of each of the cases is pivotally connected to at least one fixture lid, and the fixture lid covers the face of the case further away from the bottom wall of the shell body.

7. The server housing according to claim 6, wherein an abutting screw is disposed at an overhanging portion on the free end of the fixture lid.

8. The server housing according to claim 7, wherein a plurality of contact protrusions are formed on the bottom wall of the shell body.

* * * * *